United States Patent
Hartwich et al.

(10) Patent No.: US 9,300,323 B2
(45) Date of Patent: Mar. 29, 2016

(54) METHOD AND DEVICE FOR SERIALLY TRANSFERRING DATA, HAVING SWITCHABLE DATA ENCODING

(75) Inventors: Florian Hartwich, Reutlingen (DE); Thomas Lindenkreuz, Reutlingen (DE)

(73) Assignee: Robert Bosch Gmbh, Stuttgart (DE)

( * ) Notice: Subject to any disclaimer, the term of this patent is extended or adjusted under 35 U.S.C. 154(b) by 227 days.

(21) Appl. No.: 14/113,018

(22) PCT Filed: Apr. 19, 2012

(86) PCT No.: PCT/EP2012/057108
§ 371 (c)(1),
(2), (4) Date: Feb. 26, 2014

(87) PCT Pub. No.: WO2012/143411
PCT Pub. Date: Oct. 26, 2012

(65) Prior Publication Data
US 2014/0298133 A1    Oct. 2, 2014

(30) Foreign Application Priority Data
Apr. 20, 2011   (DE) .................. 10 2011 007 766

(51) Int. Cl.
| H03M 13/00 | (2006.01) |
| H03M 13/09 | (2006.01) |
| G06F 13/42 | (2006.01) |
| H04L 12/417 | (2006.01) |
| H04L 12/40 | (2006.01) |

(52) U.S. Cl.
CPC .......... *H03M 13/09* (2013.01); *G06F 13/4295* (2013.01); *H04L 12/417* (2013.01); *H04L 2012/40215* (2013.01)

(58) Field of Classification Search
CPC ............................ H03M 3/09; H03M 13/096
See application file for complete search history.

(56) References Cited

U.S. PATENT DOCUMENTS

| 5,784,547 A * | 7/1998 | Dittmar et al. ................. 714/4.5 |
| 6,985,975 B1 * | 1/2006 | Chamdani et al. .............. 710/55 |
| 8,509,257 B2 * | 8/2013 | Yakashiro ..................... 370/421 |

(Continued)

FOREIGN PATENT DOCUMENTS

| CN | 101836397 A | 9/2010 |
| DE | 100 00 305 A1 | 7/2001 |

(Continued)

OTHER PUBLICATIONS

Cena G et al.: "Overclocking of controller area network", Electronics Letters, IEE Stevenage, GB, vol. 35, No. 22, Oct. 28, 1999, pp. 1923-1925, XP006012867, ISSN: 0013-5194, DOI: 10.1049/EL:19991289.

(Continued)

*Primary Examiner* — Esaw Abraham
(74) *Attorney, Agent, or Firm* — Kenyon & Kenyon LLP

(57) ABSTRACT

A method and an apparatus for data transfer in a network having at least two data processing units that exchange messages via the network are described, the exchanged messages having a logical structure in accordance with the CAN specification ISO 11898-1, coding of the bits for at least one first predefinable region within the exchanged messages being accomplished according to the method in accordance with the CAN standard ISO-11898-1, and such that when a switchover condition exists, coding of the bits for at least one second predefinable region within the exchanged messages is accomplished according to a method departing from the CAN standard ISO 11898-1.

24 Claims, 5 Drawing Sheets

(56) References Cited

U.S. PATENT DOCUMENTS

2006/0250803 A1* 11/2006 Chen .............................. 362/373
2010/0046520 A1* 2/2010 Nakata .......................... 370/394

FOREIGN PATENT DOCUMENTS

| DE | 10000305 A1 | 7/2001 |
| DE | 101 53 085 A1 | 5/2003 |
| DE | 103 11 395 A1 | 9/2004 |
| DE | 10 2007 051657 A1 | 4/2009 |

OTHER PUBLICATIONS

International Search Report issued in PCT/EP2012/057108, dated Aug. 1, 2012.

* cited by examiner

METHOD AND DEVICE FOR SERIALLY TRANSFERRING DATA, HAVING SWITCHABLE DATA ENCODING

CROSS REFERENCE TO RELATED APPLICATION

The present application is the national stage entry of International Patent Application No. PCT/EP2012/057108, filed in Apr. 19, 2012, which claims priority to Application No. DE 10 2011 007 766.9, filed in the Federal Republic of Germany on Apr. 20, 2011.

FIELD OF INVENTION

The present invention relates to a method and an apparatus for transferring data in messages or data frames between at least two subscribers of a bus system.

BACKGROUND INFORMATION

The Controller Area Network (CAN), as well as an extension of CAN referred to as "time triggered CAN" (TTCAN), are described, for example, in German Application No. DE 100 00 305. The media access control method used in CAN is based on bitwise arbitration. In bitwise arbitration, several subscriber stations can simultaneously transfer data via the channel of the bus system without thereby disrupting data transfer. The subscriber stations can furthermore, upon transmission of a bit via the channel, ascertain the logical state (0 or 1) of the channel. If a value of the transmitted bit does not correspond to the ascertained logical state of the channel, the subscriber station then terminates access to the channel. With CAN, bitwise arbitration is usually performed in an arbitration field within a message to be transferred via the channel. Once a subscriber station has completely transmitted the arbitration field onto the channel, it knows that it has exclusive access to the channel. The end of the transfer of the arbitration field thus corresponds to a beginning of an authorization interval within which the subscriber station can exclusively use the channel. According to the CAN protocol specification, other subscriber stations are not allowed to access the channel, i.e., transmit data onto the channel, until the transmitting subscriber station has transferred a checksum field (CRC field) of the message. A point in time at which transfer of the CRC field ends thus corresponds to an end of the authorization interval.

Bitwise arbitration results in nondestructive transfer of messages via the channel. The messages transferred on the CAN bus are also called "data frames." Nondestructive transfer means that CAN has good real-time properties, whereas media access control methods in which the messages transmitted by one subscriber stations can be destroyed during transfer via the channel because of a collision with a further message transmitted by another station have appreciably less favorable real-time behavior, since a delay in data transfer occurs due to the collision and the retransmission of the message necessitated thereby.

The CAN protocols are suitable in particular for transferring short reports under real-time conditions. If larger data blocks are to be transferred via a CAN domain, the relatively slow bit rate of the channel then becomes a limiting factor. In order to ensure correct functioning of bitwise arbitration, a minimum duration that depends principally on the extent of the bus system, the signal propagation speed on the channel, and intrinsic processing times in the interface modules of the bus subscribers must be complied with during arbitration for the transfer of a bit, since all the bus subscribers must have a uniform picture of the bus state (0 or 1), and equal access to the bus state. The bit rate therefore cannot be arbitrarily increased by decreasing the duration of the individual bits. In order nevertheless to allow sufficiently fast transfer, via a communication interface that is actually provided for connection to a CAN domain, of a relatively large data block necessary for programming a control unit, German Application No. DE 101 53 085 proposes that for transfer of the data block, the communication interface be switched over temporarily into a different communication mode in which bitwise arbitration is not carried out and a relatively high bit rate is thus possible. Communication using the CAN protocols must, however, be interrupted for a certain time in this context. For example, if operation of the bus system according to the CAN protocols can no longer be effected because of an error, a failure of the bus system then occurs. In addition, the transfer of a relatively large data block results in a considerable delay in the subsequent transfers to be performed in accordance with CAN protocols, so that the real-time properties of the CAN system are impaired.

German Application No. DE 103 11 395 describes a system in which asynchronous, serial communication can be accomplished alternatively via an asymmetrical physical protocol or the symmetrical physical CAN protocol, and a higher data transfer rate or data transfer security for asynchronous communication is thereby attainable.

German Application No. DE 10 2007 051 657 proposes to utilize an asynchronous, fast, non-CAN-conforming data transfer in the exclusive time windows of the TTCAN protocol, in order to increase the volume of data transferred.

G. Cena and A. Valenzano, "Overclocking of controller area networks," Electronics Letters, Vol. 35, No. 22, p. 1924 (1999), discusses in theoretical terms the effects of overclocking the bus frequency in sub-regions of the message on the effective data rate that is effectively achieved, but without going into details as to methodology and the various states and state transitions of the bus subscribers.

It is apparent from the documents cited that the existing art does not provide satisfactory results in every respect.

SUMMARY

The present invention describes a method with which, in a CAN network, messages can be transferred in a shorter time, and at the same time essential properties of the CAN system in terms of error detection and error management, as well as network-wide data consistency, are retained. What is proposed for this purpose is a data transfer method, hereinafter called "alternate coding CAN" (AC-CAN), that is modified with respect to the CAN protocol per ISO 11898-1 to -4, hereinafter called "standard CAN."

The above-described object is achieved by the data transfer method and the apparatus according to the present invention.

The above-described object is achieved according to the present invention in that bit coding within a message is accomplished using at least two different methods, coding of the bits for at least one first predefinable region within the exchanged messages being accomplished according to the method in accordance with the CAN standard ISO 11898-1; and when a switchover condition exists, coding of the bits for at least one second predefinable region within the exchanged messages is accomplished according to a method departing from the CAN standard ISO 11898-1.

An advantage of this method is that the logical structure of the CAN messages is largely retained, i.e., at least for the region between the SOF and the CRC delimiter. The interface to the application program can accordingly remain unchanged. AC-CAN controllers can also be used in standard CAN networks. In a network that encompasses exclusively subscribers having AC-CAN controllers, all the subscribers switch into the fast mode after arbitration, so that all the synchronization and error detection mechanisms can continue to perform their functions. It is furthermore advantageous that the coding used in the second region can be selected so that an elevated data transfer rate, elevated data transfer security, or less emission of electromagnetic waves is achieved.

Advantageously, when the switchover condition exists, what is used in the aforesaid second region is an NRZ coding with a smaller voltage swing and a recessive level weakly driven by the transmitting subscriber station, or an NRZI coding in which the occurrence of a signal edge is interpreted as a dominant bit. It can likewise be advantageous to use a frequency or amplitude modulation or shift to represent the recessive and dominant bits. It is particularly advantageous in this context if a third frequency or amplitude is utilized in order to signal a detected error in the data transfer.

In a particularly advantageous exemplary embodiment, when the switchover condition exists, the electrical resistance between the bus leads is adapted, by switchable resistors, to the method for bit coding.

It can additionally be advantageous also, in parallel with the transfer of bits according to the method departing from the standard, to transfer bits according to the standard coding method.

In order to achieve the advantage that the data transfer rate becomes elevated, it is possible, in a third region that is encompassed by the second region or coincides with it, to elevate the bus clock rate, for example, by adapting a scaling factor for setting the bus time unit relative to a smallest time unit or to the oscillator clock rate.

For reasons that include maintaining error security, it is advantageous that the second or third region with modified transfer ends upon detection of a reason to start an error frame or when a bit defined for switching back is reached.

Advantageously, the second region begins upon assignment of bus access by arbitration, at the earliest with the first bit of the data length code, and ends at the latest with the CRC delimiter, and the existence of the switchover condition is signaled by a suitable identifier, in order to ensure bus-wide data consistency for correct assignment of bus access. In a context of time-controlled bus communication, it can be advantageous to allow the second region to begin even earlier, at the earliest with the start of frame bit.

Lastly, it is advantageous if the communication protocol is modified such that transmitting bus subscribers, at least when a switchover condition exists, accept an acknowledgement of correct reception of a message by one or more receivers that is one bit too late with respect to the ISO 11989-1 specification, and/or an acknowledge slot that is a maximum of two bits long, and do not treat it as an error. This avoids the occurrence of unnecessary error messages if, because of signal transit times or internal processing times, state transitions between the transfer methods in different bus subscribers take place at times that do not exactly coincide.

Exemplary embodiments of the present invention will be explained in further detail below with reference to the accompanying drawings.

DETAILED DESCRIPTION

Exemplary embodiments of the method according to the present invention and the apparatus will be described below. These concrete examples are used to explain the embodiments, but do not limit the scope of the inventive idea.

Firstly, in a first exemplary embodiment with reference to FIGS. 1 to 3, the states of the AC-CAN controller according to the present invention and the pertinent data transfer properties will be described, as well as their transitions and the transition conditions necessary therefor.

Figure 1:
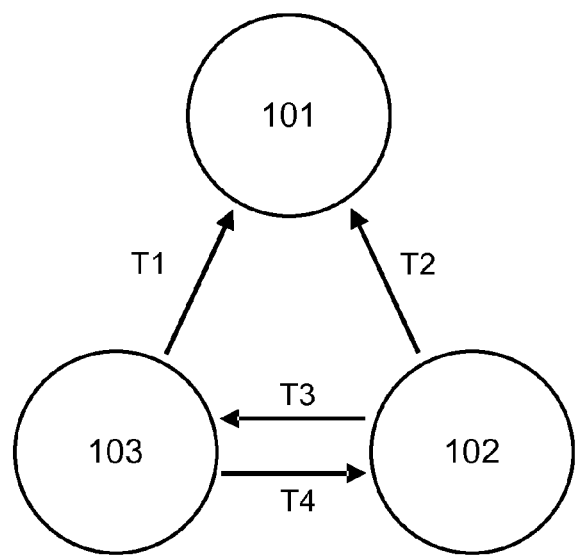
FIG. 1 is a schematic state diagram showing the various states that an AC-CAN controller can assume in terms of the method according to the present invention, as well as the transition conditions.

FIG. 1 depicts the three operating states of the AC-CAN controller: Standard CAN 101, AC-CAN Arbitration 102, and AC-CAN Data 103. In the Standard CAN operating state 101, it operates according to the standard CAN protocol. In the AC-CAN Arbitration operating state 102, it behaves like a standard CAN controller but can also switch into the AC-CAN Data state 103. In the AC-CAN Data state 103, its behavior departs from that of a standard CAN controller, since the bits to be transferred via the bus are coded according to an alternative method. After switch-on, the controller according to the present invention is in the AC-CAN Arbitration mode 102 when this is requested by the application program. Otherwise, it is in the Standard CAN mode 101 after switch-on.

As part of the modified bit coding or in addition thereto, the bus clock rate can also be modified in the AC-CAN Data state 103. Provision can be made for a change in the scaling factor (prescaler) between the bus clock and oscillator clock in the course of operation. The length of the bus time units is thereby adjusted. The long bus time unit is used in the AC-CAN Arbitration 102 and Standard CAN 101 states, and the short bus time unit in the AC-CAN Data state 103. The total time span required for transferring the data, for example, the data length code, data field, and CRC field, can therefore be different in the AC-CAN Data state as compared with the time span that would be required for data transfer according to the standard.

In an alternative exemplary embodiment, the use of the alternative coding for bits and the change in the bus clock rate can also be accomplished mutually independently, provided a "bus clock rate" is still relevant in the context of the coding used, i.e., the individual bits of the message are transferred in chronological sequence one after another. The state diagram analogous to FIG. 1 is then correspondingly more complex, since it must then contain the various combinations of the possible changes in the transfer method (normal/modified coding, normal/modified clock rate) and their transitions. The simple state diagram according to FIG. 1 will be used as the basis hereinafter.

In the AC-CAN Arbitration state 102, for example, the "reserved bit" R0, which is located in the CAN frame before the data length code DLC, is transmitted recessively as an identifier. The standard CAN protocol specifies that this bit must be transmitted dominantly. When an AC-CAN controller receives this bit dominantly, and when this has been set accordingly by the application program, it switches permanently into the Standard CAN state (state change T1 or T2). This ensures that AC-CAN controllers and standard CAN controllers can be used in the same network, and can then both work in the standard CAN protocol. A different bit, for which a fixed value is specified in the standard CAN protocol, can also be selected as identifier. A different switchover criterion for switching permanently into the Standard CAN state (state change T1 or T2) can be, for example, exceedance of a specific state of the CAN error counter.

An AC-CAN controller in the AC-CAN Arbitration state 102 that recessively receives as an identifier, for example, the "reserved bit" R0 before the DLC, or successfully transmits it recessively, switches over as of the sample point of that bit to an alternative bit coding, for example, to a non-return-to-zero (NRZ) coding with a smaller voltage swing, and changes into the AC-CAN Data state 103 (state change T3). In addition, it elevates the bus clock rate by switching over the scaling factor. The state change can also be accomplished at an at least approximately constant distance in time from, or once a defined number of bus time units have elapsed after, the sample point.

An AC-CAN controller in the AC-CAN Data state 103 remains in that state until one of two conditions occurs:
(A) it sees a reason for starting a CAN error frame, or
(B) it reaches the CRC delimiter in the CAN frame.

When (A) or (B) is met, the controller switches back into the AC-CAN Arbitration state 102 (state change T4).

According to the CAN protocol, there are two reasons for starting an error frame in the region between the DLC and CRC delimiter: (A1) the transmitter sees a bit error, or (A2) a receiver sees a stuff error. These reasons are independent of the method used for bit coding; in other words, the error monitoring mechanisms of the CAN protocol can continue to be utilized in this regard. At the end of the error flag that may be superimposed (the beginning of the error delimiter), all controllers in the network are in the AC-CAN Arbitration state 102.

In both (A1) and (A2), and also in (B), the changeover T4 into the AC-CAN Arbitration state 102, and thus the switchover of the scaling factor, occurs at the sample point at which the condition arrives, or at an at least approximately constant distance in time from it. The change in state can also be accomplished once a defined number of bus time units have elapsed following the sample point.

An essential property of bit coding in the context of signal transfer using standard CAN is the possibility for any bus subscriber to overwrite, with a dominant bit, all recessive bits of other bus subscribers. In standard CAN, this property is realized by the fact that the recessive level is established by the flow of a discharge current through defined termination resistors, while the dominant level is brought about by the subscriber by driving a current. This property allows any bus subscriber to participate in error monitoring and, when an error in data transfer is noted, to shift all other bus subscribers likewise into an error state by sending a dominant, active error flag (six successive dominant bits, cf. ISO 11898-1, chap. 10.4.4.2). This property must be retained when selecting suitable alternative methods for bit coding.

One alternative that is suitable for reducing electromagnetic emissions is the use of an NRZ coding that exhibits a smaller voltage swing as compared with the CAN standard and is operated with a weakly driven recessive level in order to accelerate the level change. The result is that the times necessary to establish the respective bus level are shortened, and simultaneously the currents that are flowing (and the electromagnetic fields caused thereby) are kept low. "Weakly driven" means in this context that in order to establish the recessive level, for example, the transmitting subscriber for a short time drives a current that, in parallel with the discharge current through the termination resistors, accelerates the establishment of the recessive level. The charge quantity transferred by the brief current flow is to be limited, for example, by the use of edge-triggered or threshold-value-triggered pulse generators, or by suitable closed- or open-loop control, such that other bus subscribers still retain the capability of overwriting the recessively transmitted bit in the event of an error with a dominant bit having a correspondingly stronger and/or longer current flow in the opposite direction, i.e., oppositely to the discharge current through the termination resistors and to the current additionally driven by the recessively transmitting bus subscriber.

Figure 2:
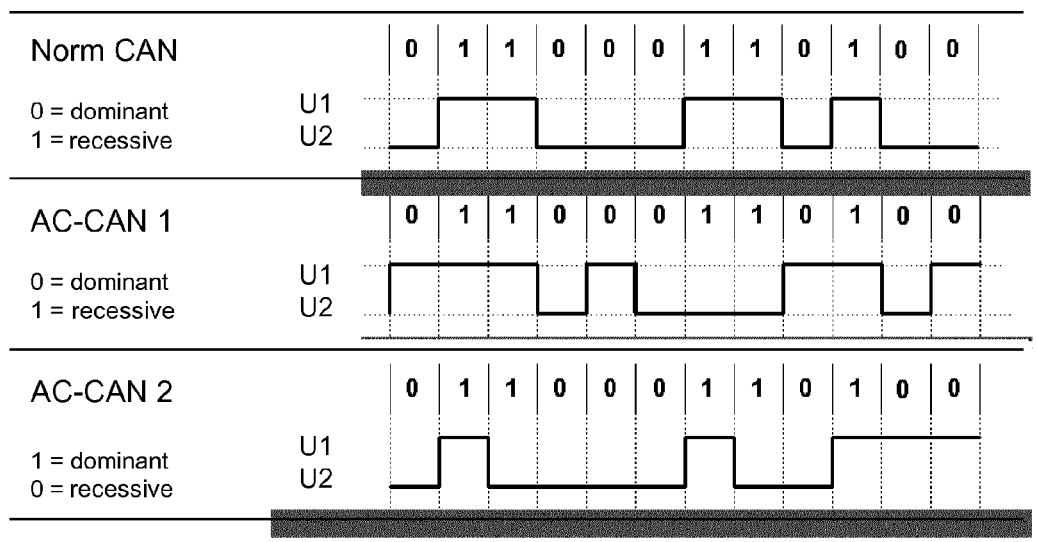
FIG. 2 shows two examples of possible methods for bit coding.

Another possible alternative to the NRZ bit coding of standard CAN is depicted as a schematic sketch in FIG. 2, in two different manifestations. The method depicted, which could be used in the AC-CAN Data state of the AC-CAN controller according to the present invention, is a coding in accordance with a non-return-to-zero inverted (NRZI) method.

In the "AC-CAN 1" example with the proposed coding method, in the AC-CAN Data state, the zeros within the bit stream, which in standard CAN are the dominant bits, are represented as an edge change between the bus levels or difference voltages U1 and U2, while the ones, i.e., the recessive bits, are represented as a constant level. Each subscriber, having a knowledge of the current bus state, can force an edge change from U1 to U2 (or in the opposite direction) by driving a suitable current, and can thus overwrite recessive bits (for which no current is being driven) of the other bus subscribers.

In the alternative "AC-CAN 2" example, in the AC-CAN Data state, the ones within the bit stream are represented as an edge change between the bus levels or difference voltages U1 and U2, while the zeros are represented as a constant level. If the zeros are, as is usual, transferred dominantly, i.e., can prevail over transferred ones, then in this exemplary embodiment, for example, every subscriber can, by creating a low-resistance connection from the two bus leads to suitable voltage sources that maintain the present difference voltage U1 or U2, prevent an edge change from U1 to U2 (or in the opposite direction), and thus overwrite recessive bits of the other bus subscribers in which a current is being driven with the goal of modifying the difference voltage U1 or U2. It would also be possible to transfer the ones dominantly and the zeros recessively, although that would require additional adaptations to the protocol specification.

A further alternative is to use a frequency modulation or frequency shift in order to code the bits. In this exemplary embodiment, in the AC-CAN Data state, the dominant and recessive bits of the bit stream of the message are represented as a signal having at least two different frequencies, for example, FD and FR, that is introduced onto the bus leads. Frequency combinations or frequency regions can also be used to represent the two bits. The frequencies here are to be selected to have a sufficient distance between them that they can be reliably separated. The amplitudes, frequencies, and lead disposition are to be selected so that unnecessary emission of electromagnetic waves does not occur. Twisted-pair leads, which optionally are additionally to be shielded, are particularly advantageous for this purpose. To ensure that a dominant error flag prevails on the bus, a third frequency FE can additionally be defined which is transmitted upon discovery of an error. This can result in even faster propagation of the information that an error has been identified.

When frequency modulation is used as a bit coding method, it can also be advantageous in each case to combine multiple bits of a message that are to be transmitted, and convert them into one frequency information item. For example, each two bits can be combined, and four different frequency information items, in particular individual frequencies, frequency combinations, or frequency groups, can be used to represent the four possible values of the two bits. If three bits are combined in each case, this correspondingly requires eight different frequencies, frequency combinations, or frequency groups; in general, combining N bits requires $2^N$ different frequency information items for mapping. In the receiver, the received frequency information item is then converted back into the serial bit sequence so that subsequent processing can be accomplished substantially without change.

In a further possible exemplary, in this case the bit stuffing from standard CAN can be suspended for the region in which frequency modulation is used as an alternative coding method. In standard CAN data transfer, stuffing (cf. ISO 11898-1, chap. 10.5) prevents the occurrence of more than five successive bits having the same bus level by interspersing additional opposite bits, thereby ensuring inter alia that edges for synchronizing the bit timing of the various bus subscribers are available on the bus at intervals that are not too large. When the frequency modulation method is used, successive bits having the same bus level are no longer relevant in many exemplary embodiments. The insertion of stuff bits by the respective transmitter is then correspondingly no longer necessary in the region in which frequency modulation is being utilized as an alternative coding method. The receiving process for that region must be analogously adapted in the transmitters.

It is likewise possible to utilize an amplitude modulation or amplitude shift in order to code the bits. In this exemplary embodiment, in the AC-CAN Data state, the dominant and recessive bits of the bit stream of the message are represented as a signal of a predefined frequency F0 having at least two different amplitudes, for example, AD and AR, which is introduced onto the bus leads. Amplitude ranges can also be used to represent the two bits. In this case the amplitudes are to be selected to be at a sufficient distance from one another that they can be reliably distinguished. The base frequency F0 and lead disposition are to be selected so that unnecessary emission of electromagnetic waves does not occur. Twisted-pair leads, which optionally are additionally to be shielded, are particularly advantageous for this purpose. To ensure that a dominant error flag prevails on the bus, a third amplitude AE, in particular an especially high amplitude, can additionally be defined which is transmitted upon discovery of an error. This can once again result in even faster propagation of the information that an error has been identified.

Further coding methods or modulation methods known to one skilled in the art can also be used. In each case, it is necessary to introduce for the bit coding selected, analogously to the exemplary embodiments discussed above, a mechanism that allows the bus subscribers to overwrite the recessively transmitted bit of a bus subscriber, authorized to transmit in accordance with arbitration, with a dominant bit or an error flag made up of multiple dominant bits.

The AC-CAN controller according to the present invention must transfer the variously coded signals over the bus leads in conjunction with one or more suitable bus terminal units or transceivers. A variety of assemblages are possible here.

Figure 3A:
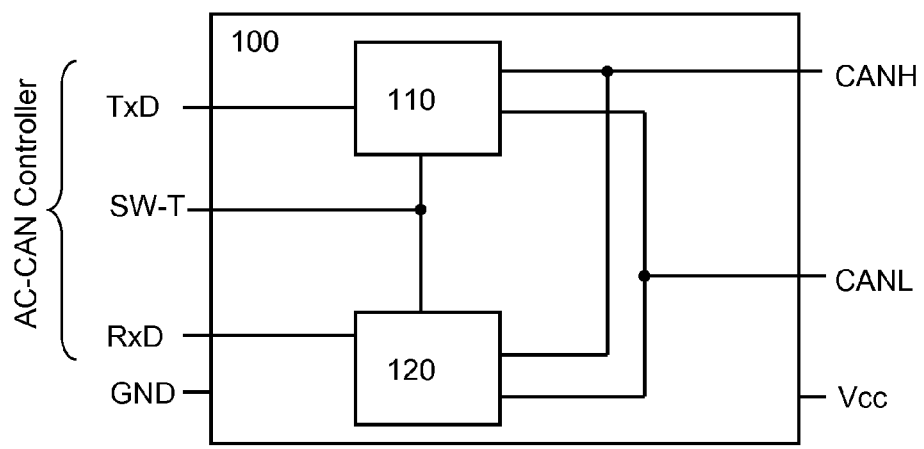
FIGS. 3*a* and 3*b* schematically show the configuration of bus terminal units suitable for implementing the method according to the present invention.

FIG. 3a depicts, as an example, a block diagram of a pertinent bus terminal unit 100 or AC-CAN transceiver. The apparatus has a circuit, having circuit elements, which can be subdivided into a transmitting sub-circuit 110 and a receiving sub-circuit 120. The transmitting and receiving sub-circuits can be connected to one another, or can even have shared circuit elements. The apparatus furthermore possesses the necessary connection capabilities, in particular terminals CANH, CANL for bus connection, terminals RxD and TxD for receiving and transmitting logical data respectively from and to the AC-CAN controller, terminal Vcc for furnishing a supply voltage, and GND to furnish a ground. Further possible terminals can encompass in accordance with the existing art, for example, enable inputs, wakeup inputs, standby inputs, etc. These have been omitted here for the sake of simplicity. Transmitting sub-circuit 110 generates, based on at least the transmit signal TxD of the AC-CAN controller, output signals for bus terminals CANH and CANL. Receiving sub-circuit 120 generates, based on at least the difference between the input signals of bus terminals CANH and CANL, a receive signal RxD for the AC-CAN controller.

In the instance depicted in FIG. 3a, the AC-CAN controller generates the serial bit signal and sends it via lead TxD to transceiver 100. In the AC-CAN Data state, the signal conveyed via lead TxD is coded, for example, according to an NRZI method and is transferred with a higher clock rate. Transceiver 100 depicted in the example can be switched over via switch lead SW from the AC-CAN controller, so that depending on the coding method, it generates the corresponding voltage levels on the bus leads. This assemblage is possible, for example, for utilization of an NRZ coding approach that has a smaller voltage swing as compared with the CAN standard, or for NRZI coding.

Figure 3B:
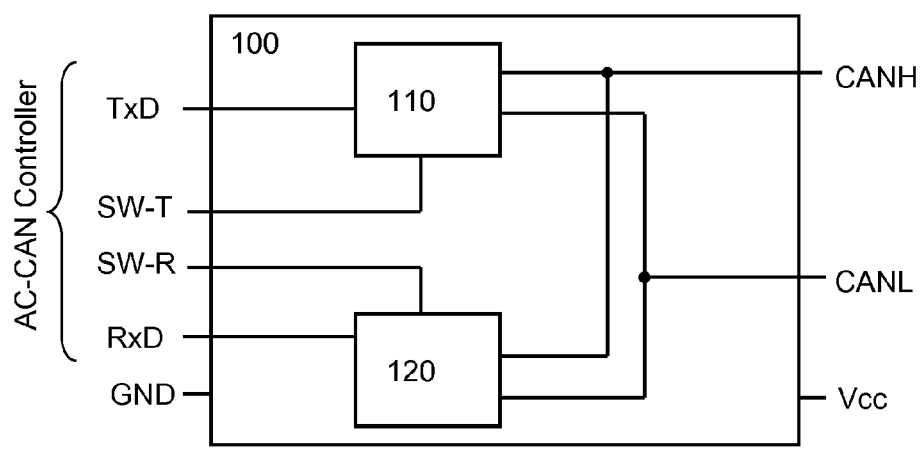

The AC-CAN controller can optionally also, as depicted in FIG. 3b, be connected via separate switch leads SW-R and SW-T to transceiver 100 in order to switch it specifically into the "AC-CAN transmit" or "AC-CAN receive" state. If the coding involves, for example, the fact that the recessive level is weakly driven by the transmitting bus subscriber and that slightly different threshold values or filters are used by the bus subscribers in the receiving path, it is useful to switch the transceiver separately into the "AC-CAN transmit" or "AC-CAN receive" states, since a receiving bus subscriber is intended to use the other threshold values or filters, but is also not intended to weakly drive the recessive level, since otherwise the resulting recessive level driven by multiple bus subscribers would no longer be able to be overwritten by a dominant bit.

In other cases, for example when amplitude or frequency shifting or modulation is used, a different assemblage is also possible, in which a separate bus terminal unit, for example, a separate transceiver, for generating the modulated AC voltage and applying it onto the bus leads, is utilized; this bus terminal unit or transceiver is activated by the AC-CAN controller via separate connections. The AC-CAN controller can optionally have for this purpose a second RxD input to which the output of a second, separate AC-CAN transceiver is connected, while activation in the transmitting case is accomplished via a TxD output connected to both transceivers. Both the TxD output and the RxD input can, however, also be provided separately for each connected transceiver.

In all the coding variants discussed, it can be useful to replace the defined termination resistors of standard CAN with switchable termination units, for example, switchable resistors in the bus terminal units which are connected to the AC-CAN controllers. As a result, in the AC-CAN Data state, the resistance value that is effective can be modified, or the resistors can be entirely separated from the bus lead.

In standard CAN networks, the termination resistors are typically manifested as two resistors of 120 ohms each in the region of the lead ends or at two bus subscribers relatively far apart from one another. In a bus system in which the method according to the present invention is utilized, the termination resistors can be distributed over many (or all) bus subscribers; the individual resistance values need to be correspondingly adapted depending on the bus subscriber. The AC-CAN controllers or pertinent bus terminal units or transceivers are, by a suitable output, given the capability of performing a switchover between at least two different termination units, for example, resistors, that are disposed between the bus leads.

Figure 3C:
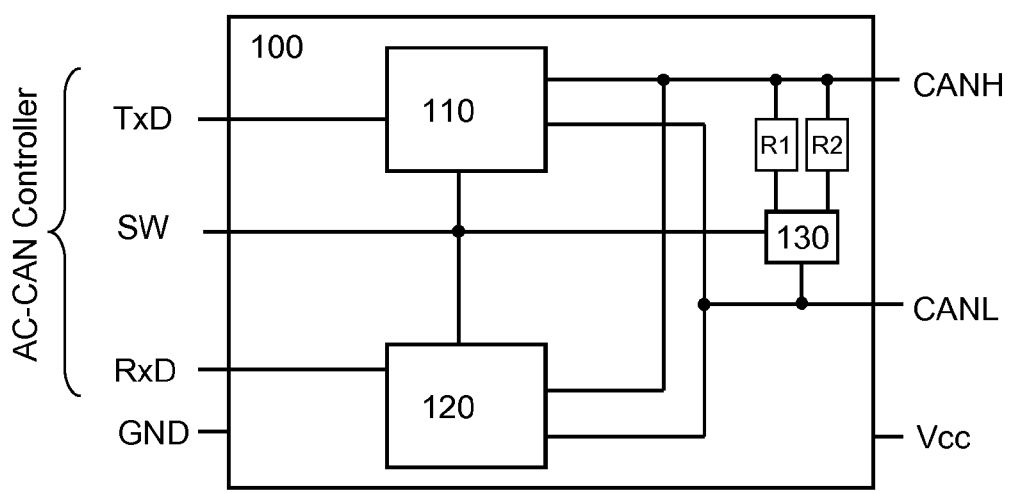
FIG. 3*c* shows a bus terminal unit of this kind that additionally has means for adapting the electrical resistance between the connected bus leads to the transfer method.

FIG. 3c is a block diagram of a pertinent bus terminal unit or AC-CAN transceiver whose switch input SW is additionally connected to a switching element 130. The switching element is connected on the one hand to bus terminal CANL and on the other hand, for example, to two different resistors R1 and R2 that are in turn connected to bus terminal CANH. The switching element can thus modify the ohmic resistance between the bus leads as a function of a control signal that is applied to switch input SW.

Assuming fifty subscribers, each equipped with AC-CAN controllers and AC-CAN transceivers, on a bus system, two switchable resistors R1=6 kilohm and R2=60 kilohm could be provided, for example, in each subscriber. The result of the switching capability is then that in the AC-CAN Arbitration and Standard CAN states, a resistance of 1/50×6 kilohm, i.e., 120 ohm, exists in the usual way between the bus leads, but that in the AC-CAN Data state the resistance would be, for example, multiplied by ten in all the bus subscribers as a result of the switchover. Any other resistance values can be implemented analogously. In the AC-CAN Data state the transmitting bus subscriber therefore does not need to work against the discharge current through the termination resistors when building up the requisite voltage level, and can thus establish the target voltage more quickly. In order to enable flexible usability in bus systems having different numbers of bus subscribers, the values of the switchable resistors could be embodied to be configurable using suitable means.

The configuration of the messages used, in particular the regions having different coding of the bits as a function of the respective state of the controller, and the identifier according to the present invention, are explained below with reference to FIG. 4.

Figure 4:
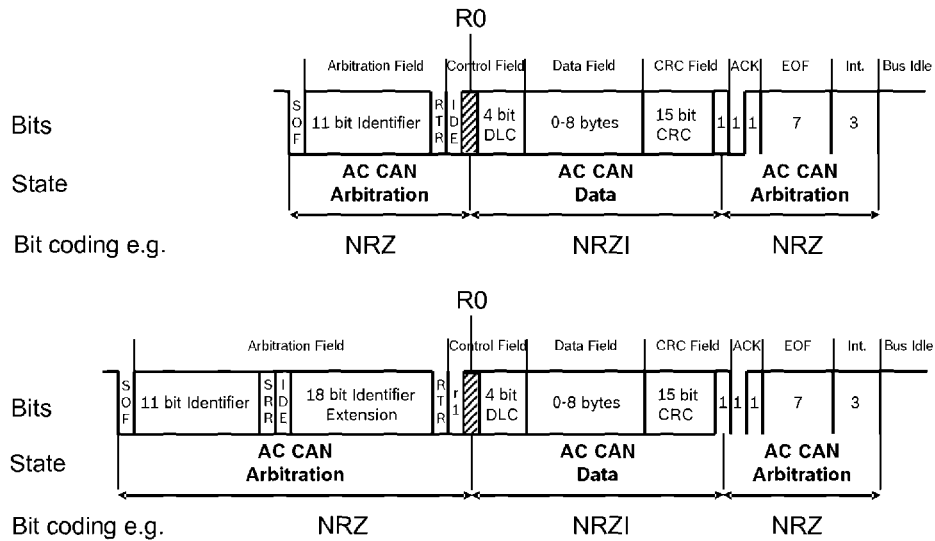
FIG. 4 shows the structure of a CAN message in standard format and in extended format, with the division according to the present invention into regions having different bit coding and with identification by a reserved bit.

FIG. 4 shows the structure of a CAN message in accordance with ISO 11898-1 in the two possible variants—the "standard format" and the "extended format." Indicated for both variants are the regions in which a switchover occurs according to the present invention between the AC-CAN Arbitration 102 and AC-CAN Data 103 states. Also depicted is the switchover associated therewith in the bit coding that is used, in the example depicted from the standard NRZ method to an NRZI method. Other possible methods have already been listed previously. Lastly, the position selected in this exemplary embodiment of the identifier according to the present invention, in the "reserved bit" R0 that is transferred before the DLC, is depicted. Another possible identifier, e.g., for "extended format" messages, is provided by the SRR bit.

The first exemplary embodiment depicted for the method according to the present invention is therefore a transfer method in which, once arbitration has been accomplished, that bus subscriber which has successfully requested bus access carries out, starting from a predefined or predefinable bit of the message, transfer of the further bits of the message by switching over to a modified bit coding, such that the bits to be transferred are transferred more quickly and/or the transfer is more interference-resistant and/or the electromagnetic waves occurring upon transfer are reduced. This first exemplary embodiment is representative of an entire group of exemplary embodiments in which the switchover to the modified bit coding is carried out only after arbitration has been accomplished. As stated, there are many possibilities here for the bit coding that is to be used.

A second exemplary embodiment for the method according to the present invention, which is representative of a second group of embodiments, is presented below with reference to FIGS. 5 and 6. It is notable for the fact that thanks to a time control system, simultaneous transmission attempts are suppressed at least for some of the messages modified according to the present invention, and it is accordingly possible to switch over even earlier within the corresponding messages to an alternative, for example faster, coding of the bits. In particular, this switchover can be accomplished already during transfer of the arbitration field.

Figure 5:
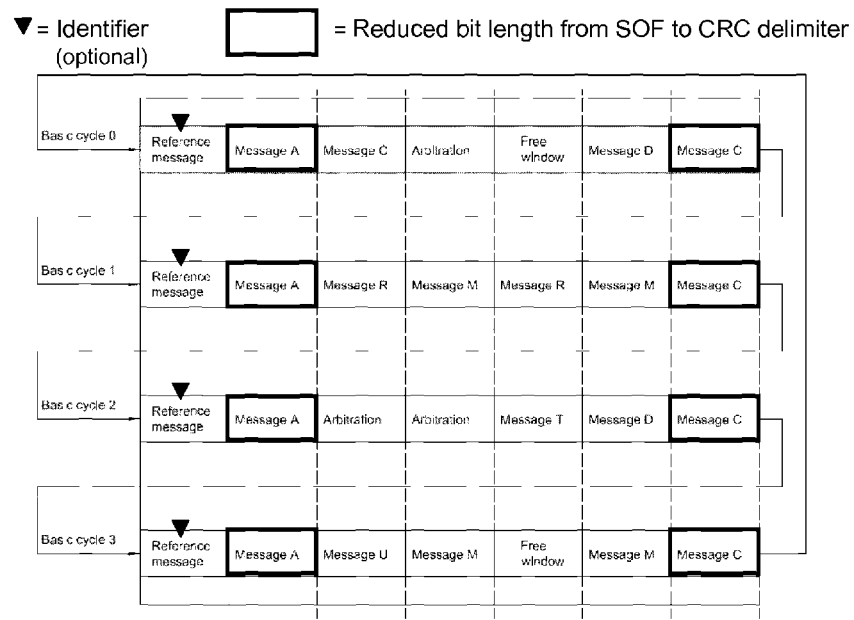
FIG. 5 shows an example of the expansion of the region of reduced bit length in the context of combination of the method with the time-controlled transfer method of the TTCAN protocol, represented by a system matrix.
Figure 6:
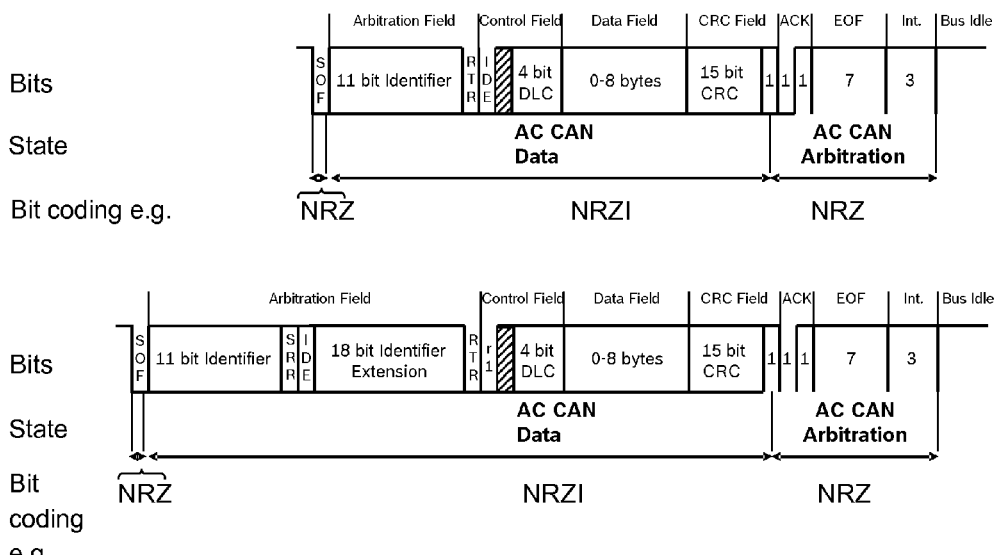
FIG. 6 shows one possibility for dividing a message in an exclusive TTCAN time window into regions having different bit coding.

FIG. 5 shows, for this purpose, a system matrix of a TTCAN network in accordance with ISO 11898-4 with the basic cycles and time windows described therein. There are time windows labeled "Message A," "Message C," etc. that are available exclusively for the transfer of specific messages, while in other time windows that are labeled "Arbitration," bus access is assigned by usual CAN arbitration.

In the second exemplary embodiment, all messages for which nothing different is described are treated in accordance with the method from the first exemplary embodiment. In addition, for specific, previously defined, exclusively assigned time windows, a switchover of bit coding is performed even earlier, for example, as of the SOF bit, and is maintained, for example, until the end of the CRC field. An example of a message transferred in this modified manner is depicted in FIG. 5. A reserved bit of the preceding reference report can be employed, for example, as an identifier for the imminent modified transfer. In the instance described, the setting of this bit would signal that the messages that are transferred in exclusive time windows in the subsequent basic cycle are being transferred, starting with the SOF bit and until the end of the CRC field, with switched-over bit coding, for example using an NRZI method or via amplitude or frequency shifting.

In another exemplary embodiment, it is conceivable for only those exclusive messages which are transferred in each basic cycle, i.e., with a repetition factor of one, to be transferred in a manner modified by the method. This instance is explicitly depicted in FIG. 5. In the system matrix depicted as an example, the messages labeled "Message A" and "Message C" would then be transferred using the method explained, with a corresponding identifier in the respectively preceding reference report.

For the method described in the second exemplary embodiment, it is also possible to omit the identifier and to stipulate that in all exclusive time windows, the messages are categorically transferred with modified bit coding in a stipulated region such as, for example, between the SOF bit and the end of the CRC field. For this reason, the identifier in FIG. 5 is labeled "optional."

Because the switchover of bit coding in the AC-CAN Data state can also be associated with a faster transfer of the bits or with an elevation in the bus clock rate, the time span needed for transferring the pertinent bits also changes. Due to oscillator inaccuracies and deviations in the exact switchover times, it may be necessary to utilize, for processing the transmit confirmation (CRC delimiter and acknowledge slot), a method modified as compared with the method specified in ISO 11898-1, as explained in further detail in FIG. 7.

Figure 7:
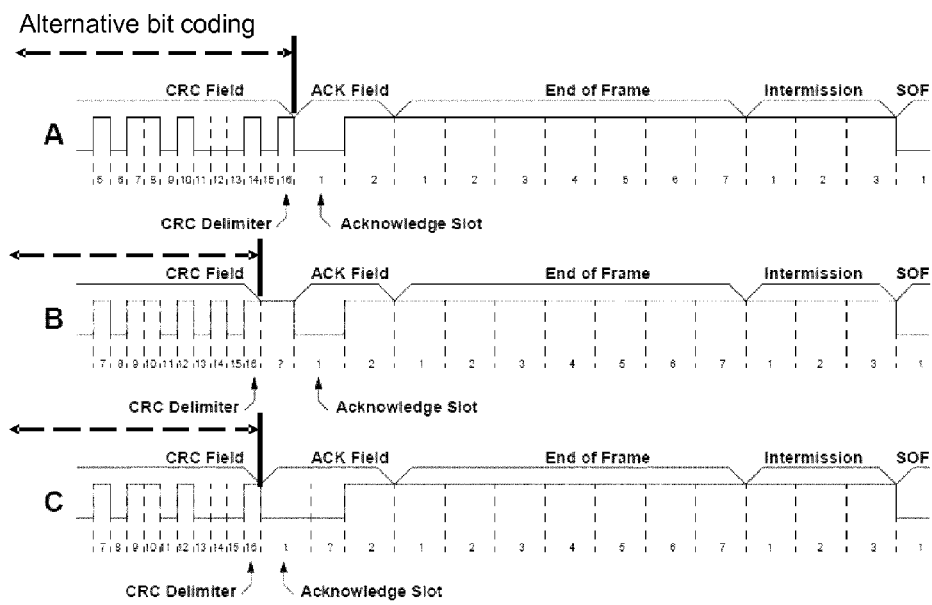
FIG. 7 shows the acceptance criteria, expanded with respect to the existing art, for a CRC delimiter or acknowledge bit in the context of the use of alternative bit coding.

Depicted in FIG. 7 under "A" is the ideal execution of the transition from the AC-CAN Data state to the AC-CAN Arbitration state in a context of very short internal processing times and signal transit times. The transmitter transmits the CRC delimiter as a single recessive bit and, in accordance with the exemplary embodiments of the present invention that have been described above, changes over into the AC-CAN Arbitration state, for example, at the sample point of that CRC delimiter bit or once a stipulated time thereafter has elapsed. The receivers also change into the AC-CAN Arbitration state, for example, at this bit position. As a result of, for example, signal transit times or internal processing times, these state transitions T4 may take place in the various bus subscribers at points in time that do not exactly coincide. The participating bus subscribers thus set the method for bit coding back into the original state at points in time that do not exactly coincide. This results, for the bus subscribers, in different starting times for the next bit.

After reception of the CRC delimiter, each receiver transmits a single dominant acknowledge bit if its CRC check was positive. If this happens relatively late, for example because the receivers are attached at distant ends of the bus, the recessive CRC delimiter bit can appear to be longer than one bit. This instance is depicted in FIG. 7 under "B". Due to superposition of acknowledge bits, the acknowledge slot can also appear to be longer than one bit, as depicted in FIG. 7 under "C". In order to compensate as applicable for the phase-shifted transmission times of these acknowledge bits, the processing of these bits in AC-CAN controllers can be modified such that in the AC-CAN Arbitration state, a dominant acknowledge slot one or two bits long, that begins directly after the CRC delimiter or even one bit later, is recognized as a valid acknowledgement.

The trailing edge of the acknowledge bit then causes the bus subscribers to be synchronized again in the context of the usual resynchronization mechanism. If not only one, but instead two further recessive bits are received by the transmitter after the first bit of the CRC delimiter, this is an acknowledge error for the transmitter. If a third dominant bit is received after the second dominant acknowledge bit, this is a format error for everyone.

As in standard CAN, the acknowledge slot is followed by a recessive acknowledge delimiter that is one bit long. As in standard CAN, an AC-CAN receiver that has detected a CRC error will start the error frame only in the bit after the acknowledge delimiter.

In summary, the present invention provides a method with which, in a CAN network, messages can be transferred by a modified bit coding in a shorter time and/or with reduced emission of electromagnetic waves and/or with greater immunity to interference, and at the same time essential properties of CAN in terms of error detection and processing, as well as network-wide data consistency, are retained.

What is claimed is:

1. A method for performing data transfer in a network having at least two data processing units that exchange messages via a bus of the network, the exchanged messages having a logical structure in accordance with a controller area network (CAN) standard ISO 11898-1, the method comprising:
    coding, by at least one of the data processing units, bits for at least one first region within the exchanged messages according to a method in accordance with the CAN standard ISO-11898-1;
    transferring, by the at least one of the data processing units, bits of the at least one first region within the exchanged message in a first data transfer mode;
    when a switchover condition exists, coding, by the at least one of the data processing units bits for at least one second region within the exchanged messages according to a method departing from the CAN standard ISO 11898-1: and
    transferring, by the at least one of the data processing units, bits of the at least one second region within the exchanged message in a second data transfer mode, wherein the coding for the at least one second region is selected such that the second data transfer mode achieves at least one of an elevated data transfer rate, elevated immunity to external interference, and less emission of electromagnetic waves in comparison to the first data transfer mode.

2. The method according to claim 1, wherein the coding for the second region includes a non-return-to-zero (NRZ) coding that has a smaller voltage swing as compared with the CAN standard and in which a recessive level is weakly driven.

3. The method according to claim 1, wherein the coding for the second region includes an NRZI coding, an occurrence of a signal edge being interpreted as dominant and an absence of an edge being interpreted as recessive.

4. The method according to claim 1, wherein the coding for the second region includes a frequency modulation or frequency shift, a first frequency or group of frequencies, or a first frequency range, being interpreted as dominant, and a second frequency or group of frequencies, or a second frequency range, being interpreted as recessive.

5. The method according to claim 4, wherein a third frequency or group of frequencies, or a third frequency range, is utilized in the second region to signal a detected error in the data transfer.

6. The method according to claim 1, the coding for the second region includes an amplitude modulation or amplitude shift, a first amplitude or a first amplitude range being interpreted as dominant, and a second amplitude or a second amplitude range being interpreted as recessive.

7. The method according to claim 6, wherein a third amplitude or a third amplitude range is utilized in the second region to signal a detected error in the data transfer.

8. The method according to claim 1, wherein in the second region, besides the transfer of bits having alternative coding, data are additionally also transferred in accordance with the CAN standard ISO 11898-1.

9. The method according to claim 1, wherein when the switchover condition exists, besides a change in the coding of the bits, a change in a bus clock rate also takes place in a third region, the third region being encompassed by the second region or coinciding with the second region.

10. The method according to claim 9, wherein the change in the bus clock rate is realized by utilizing at least two different scaling factors for setting a bus time unit relative to a smallest time unit or to an oscillator clock rate in a course of operation.

11. The method according to claim 10, wherein the third region of bus subscribers ends immediately after detection of a reason for starting an error frame or immediately after a bit stipulated for switching back is reached, and the bus clock rate in the bus subscribers is set back to a value of the first region.

12. The method according to claim 9, wherein in the second or third region, an electrical resistance between bus leads is adapted to a transfer method used in the respective region.

13. The method according to claim 1, wherein the second region of bus subscribers ends immediately after detection of a reason for starting an error frame or immediately after a bit stipulated for switching back is reached, and coding of the bits in the bus subscribers is again accomplished according to the method of the first region.

14. The method according to claim 1, wherein bus access is assigned by arbitration in accordance with ISO 11898-1, the second region in which a discrepant coding of the bits is accomplished beginning within the message at an earliest with a first bit of a data length code, and ending at a latest with a bit of a CRC delimiter.

15. The method according to claim 1, wherein an existence of a switchover condition is signaled to the data processing units exchanging the messages by an identifier located within the first region.

16. The method according to claim 15, wherein the identifier is implemented by a reserved bit within a control field or an arbitration field of the message.

17. The method according to claim 1, wherein bus access is assigned by way of a time-controlled method in accordance with ISO 11898-4, and the second region in which a discrepant coding of the bits is accomplished begins for selected messages within those messages at an earliest with a start of frame bit, and ends at a latest with a bit of a CRC delimiter.

18. The method according to claim 17, wherein an existence of a switchover condition for the selected messages is stipulated in a context of configuration of the time-controlled bus communication.

19. The method according to claim 17, wherein an existence of a switchover condition for the selected messages is signaled to the data processing units exchanging messages by an identifier located in a previously transmitted reference report.

20. The method according to claim 1, wherein a transition to the second region in bus subscribers is carried out immediately after detection of an identifier stipulated for the switchover or of a bit stipulated for the switchover, and the coding of the bits is changed.

21. The method according to claim 1, wherein a transition to the third region in bus subscribers is carried out immediately after detection of an identifier stipulated for the switchover or of a bit stipulated for the switchover, and a bus clock rate is changed.

22. The method according to claim 1, wherein a communication protocol is modified such that transmitting bus subscribers, at least when the switchover condition exists, accept an acknowledgement of correct reception of a message by one or more receivers that is one bit too late with respect to CAN standard ISO 11989-1, and/or an acknowledge slot that is a maximum of two bits long, and do not treat it as an error.

23. An apparatus for gala transfer of data in messages exchanged via a bus of a network having at least one other apparatus comprising:
    a controller including a processor configured to:
    code bits for at least one first region within the exchanged messages according to a method in accordance with a controller area network (CAN) standard ISO-11898-1;
    transfer bits of the at least one first region within the exchanged message in a first data transfer mode;
    when a switchover condition exists, code bits for at least one second region within the exchanged messages according to a method departing from the CAN standard ISO 11898-1; and
    transfer bits of the at least one second region within the exchanged message in a second data transfer mode, wherein the coding for the at least one second region is selected such that the second data transfer mode achieves at least one of an elevated data transfer rate, elevated immunity to external interference, and less emission of electromagnetic waves in comparison to the first data transfer mode.

24. The apparatus according to claim 23, further comprising:
    means for activating a bus terminal unit or a terminating unit, the bus terminal unit or the terminating unit being adapted, by way of the activation, to the data transfer method being used.

* * * * *